US008964497B2

(12) United States Patent
Yu (10) Patent No.: US 8,964,497 B2
(45) Date of Patent: Feb. 24, 2015

(54) BIT LINE SENSE AMPLIFIER AND LAYOUT METHOD THEREFOR

(71) Applicant: SK Hynix Inc., Icheon-si, Gyeonggi-do (KR)

(72) Inventor: Hyoun Mi Yu, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 8 days.

(21) Appl. No.: 13/720,886

(22) Filed: Dec. 19, 2012

(65) Prior Publication Data

US 2014/0050040 A1 Feb. 20, 2014

(30) Foreign Application Priority Data

Aug. 16, 2012 (KR) .................... 10-2012-0089552

(51) Int. Cl.
*G11C 7/00* (2006.01)
*G11C 7/06* (2006.01)
*H01L 29/66* (2006.01)
*H01L 27/02* (2006.01)
*H01L 27/105* (2006.01)
*H01L 27/108* (2006.01)

(52) U.S. Cl.
CPC .......... *G11C 7/065* (2013.01); *H01L 29/66477* (2013.01); *H01L 27/0207* (2013.01); *H01L 27/1052* (2013.01); *H01L 27/10897* (2013.01)
USPC .............................. 365/205; 365/63; 365/207

(58) Field of Classification Search
CPC ........ G11C 7/02; G11C 7/06; G11C 11/4091; G11C 7/065; H01L 29/66; H01L 27/0207; H01L 29/66477; H01L 27/1052; H01L 27/10897

USPC .................... 365/63, 205, 207, 214; 438/197
See application file for complete search history.

(56) References Cited

U.S. PATENT DOCUMENTS

| 5,325,336 | A | * | 6/1994 | Tomishima et al. | 365/207 |
| 5,677,886 | A | * | 10/1997 | Seo et al. | 365/203 |
| 7,009,900 | B2 | * | 3/2006 | Goldbach et al. | 365/205 |
| 7,030,437 | B2 | * | 4/2006 | Yodogawa et al. | 257/296 |
| 7,660,141 | B2 | * | 2/2010 | Chang | 365/63 |
| 7,956,421 | B2 | * | 6/2011 | Becker | 257/369 |
| 2001/0048620 | A1 | * | 12/2001 | Fischer et al. | 365/200 |
| 2005/0157527 | A1 | * | 7/2005 | Hirose et al. | 365/63 |
| 2005/0213407 | A1 | * | 9/2005 | Myoung Rho | 365/207 |
| 2006/0092731 | A1 | * | 5/2006 | Kang et al. | 365/203 |
| 2009/0224317 | A1 | * | 9/2009 | Becker | 257/337 |
| 2013/0242645 | A1 | * | 9/2013 | Calhoun et al. | 365/154 |

* cited by examiner

*Primary Examiner* — Tan T. Nguyen
(74) *Attorney, Agent, or Firm* — William Park & Associates Patent Ltd.

(57) ABSTRACT

A bit line sense amplifier and a layout method therefor which can reduce coupling capacitance. The bit line sense amplifier is disposed between a first memory cell block and a second memory cell block adjacent to the first memory cell block and configured to include first and third switching elements substantially symmetrically formed in a first direction so that the drain terminals of the first and third switching elements face each other, second and fourth switching elements substantially symmetrically formed in the first direction so that the drain terminals of the second and fourth switching elements face each other, a first line configured to electrically couple the gate terminal of the first switching element and the drain terminal of the second switching element, and a second line configured to electrically couple the gate terminal of the third switching element and the drain terminal of the fourth switching element.

18 Claims, 6 Drawing Sheets

BIT LINE SENSE AMPLIFIER AND LAYOUT METHOD THEREFOR

CROSS-REFERENCES TO RELATED APPLICATION

The present application claims priority under 35 U.S.C. §119(a) to Korean application number 10-2012-0089552, filed on Aug. 16, 2012, in the Korean Intellectual Property Office, which is incorporated herein by reference in its entirety.

BACKGROUND

1. Technical Field

The present invention generally relates to a semiconductor integrated circuit, and more particularly, to a bit line (BL) sense amplifier and a layout method therefor.

2. Related Art

In a semiconductor memory device, a BL sense amplifier is a circuit for amplifying a fine difference between signals that are generated in bit lines due to charge sharing between a memory cell and the bit lines after the memory cell is selected.

As the degree of integration of semiconductor devices increases, a BL sense amplifier has been developed from a folded bit line structure to an open bit line structure. The BL sense amplifier having the open bit line structure amplifies a difference between the signals of a pair of bit lines, extending from a memory cell block adjacent to the BL sense amplifier, using the bit lines as a primary bit line and a secondary bit line.

Figure 1:
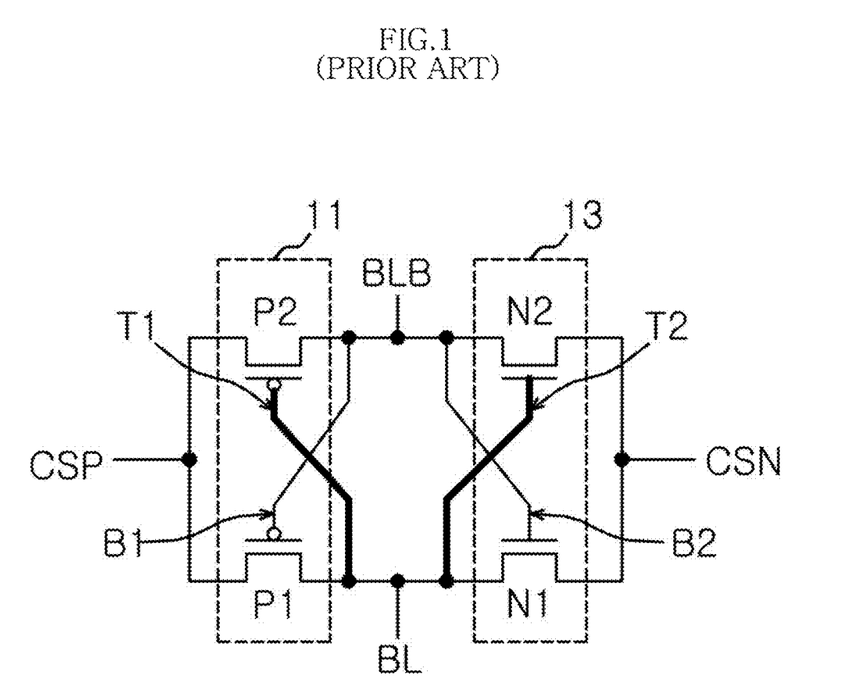
FIG. 1 shows the construction of a common BL sense amplifier.

FIG. 1 shows the construction of a common BL sense amplifier and shows the construction of a 2-stage open BL sense amplifier.

In general, the BL sense amplifier can include a sense amplifier unit, a precharge and equalization unit, a column selection unit, etc. FIG. 1 shows only the sense amplifier unit.

Referring to FIG. 1, the sense amplifier unit of the BL sense amplifier includes a first sense amplifier 11 and a second sense amplifier 13.

The first sense amplifier unit 11 includes a first P type transistor P1 and a second P type transistor P2. The first P type transistor P1 has a source terminal connected to a power source voltage supply line CSP, a gate terminal connected to a bit line bar BLB, and a drain terminal connected to a bit line BL. The second P type transistor P2 has a source terminal connected to the power source voltage supply line CSP, a gate terminal connected to the bit line BL, and a drain terminal connected to the bit line bar BLB.

The second sense amplifier unit 13 includes a first N type transistor N1 and a second N type transistor N2. The first N type transistor N1 has a source terminal connected to a ground voltage supply line CSN, a gate terminal connected to the bit line bar BLB, and a drain terminal connected to the bit line BL. The second N type transistor N2 has a source terminal connected to the ground voltage supply line CSN, a gate terminal connected to the bit line BL, and a drain terminal connected to the bit line bar BLB.

Furthermore, the gate terminal of the first P type transistor P1 and the drain terminal of the second P type transistor P2 are coupled by a first lower line B1 that extends from a memory cell block to which the bit line bar BLB is connected. The gate terminal of the first N type transistor N1 and the drain terminal of the second N type transistor N2 are coupled by a second lower line B2 that extends from the memory cell block to which the bit line bar BLB is connected.

Furthermore, the gate terminal of the second P type transistor P2 and the drain terminal of the first P type transistor P1 are coupled by a first upper line T1 that extends from a memory cell block to which the bit line BL is connected. The gate terminal of the second N type transistor N2 and the drain terminal of the first N type transistor N1 are coupled by a second upper line T2 that extends from the memory cell block to which the bit line BL is connected.

Figure 2:
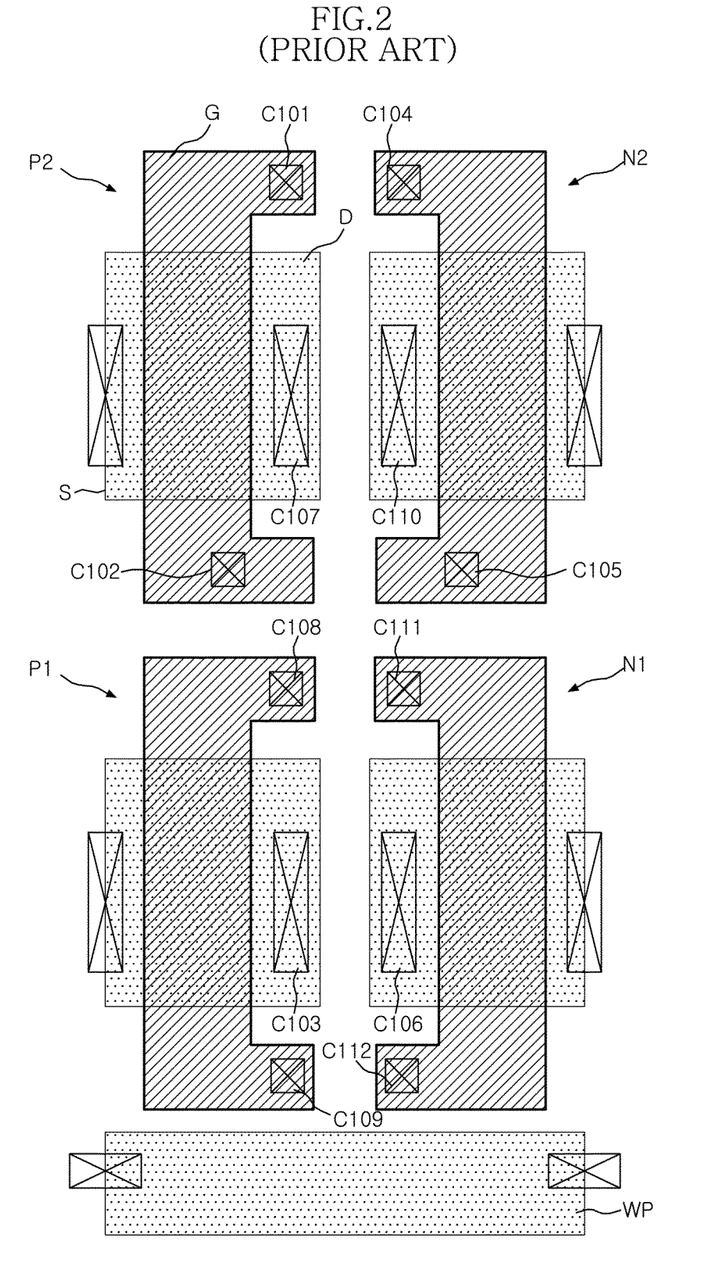
FIGS. 2 and 3 are the layout diagrams of a common BL sense amplifier.
Figure 3:
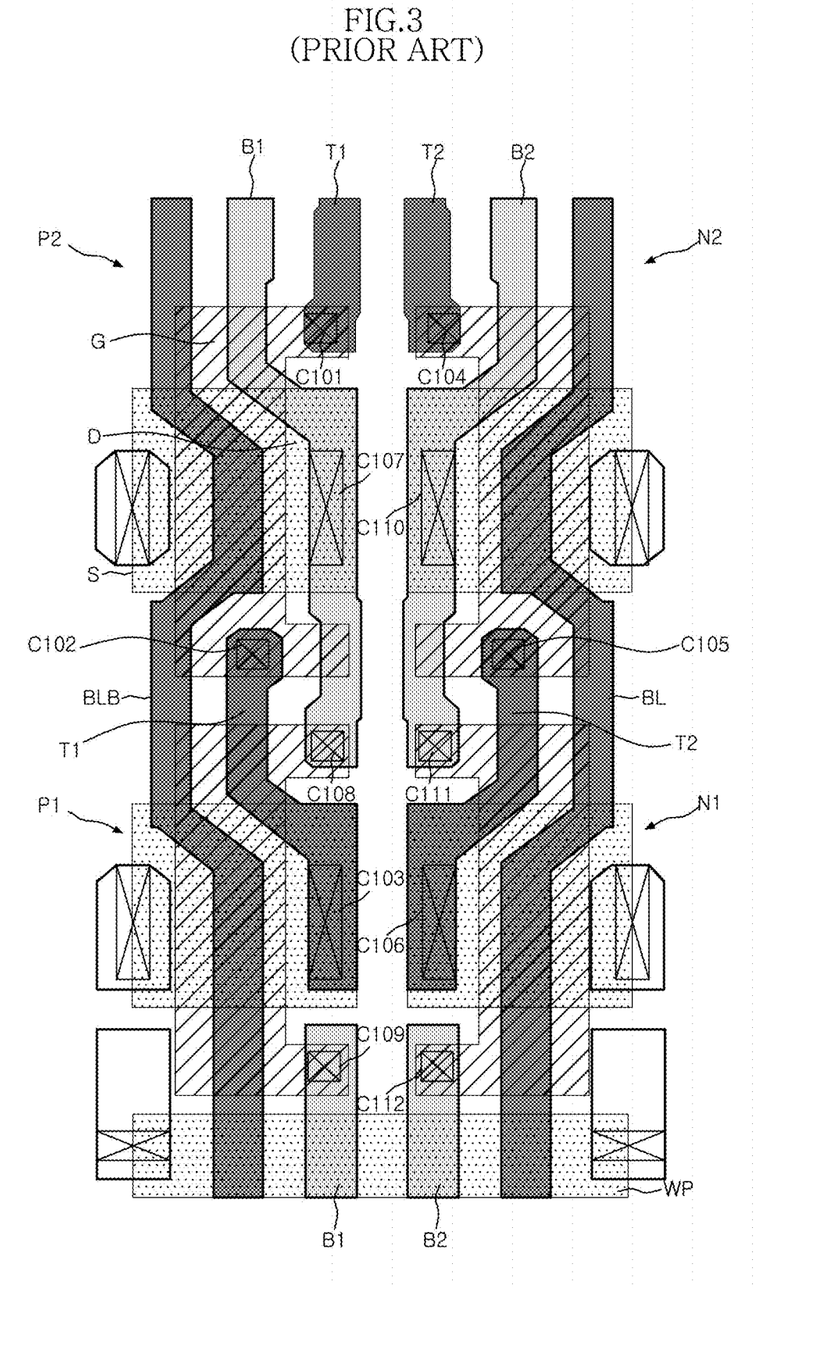

FIGS. 2 and 3 are the layout diagrams of the common BL sense amplifier.

First, FIG. 2 shows a state in which the first and the second P type transistors P1 and P2 and the first and the second N type transistors N1 and N2 are formed over a semiconductor substrate. The transistors are formed using a similar method, and the second P type transistor P2 is described below as an example. An active region is defined in the semiconductor substrate, a gate G is formed, and a source S and a drain D are then formed by an ion implantation process, thereby being capable of forming the second P type transistor P2. A well pick-up region WP is a region for supplying a power source to the junction region S, D.

After forming a pair of the P type transistors P1 and P2 and a pair of the N type transistors N1 and N2 as shown in FIG. 2, the gate and drain terminals between each transistor is coupled by a line as shown in FIG. 3.

As described above, the gate terminal of the second P type transistor P2 and the drain terminal of the first P type transistor P1 are coupled by the first upper line T1. To this end, as shown in FIGS. 2 and 3, a process of forming a first contact C101, a process of forming a second contact C102 and a third contact C103, and a process of forming the first upper line T1 are performed.

Furthermore, in order to couple the gate terminal of the second N type transistor N2 and the drain terminal of the first N type transistor N1, fourth to sixth contacts C104, C105, and C106 are formed and electrically coupled by the second upper line T2.

Likewise, the gate terminal of the first P type transistor P1 and the drain terminal of the second P type transistor P2 are coupled by the first lower line B1. To this end, seventh to ninth contacts C107, C108, and C109 are used.

Furthermore, the gate terminal of the first N type transistor N1 and the drain terminal of the second N type transistor N2 are coupled by tenth to twelfth contacts C110, C111, and C112 and the second lower line B2.

If the BL sense amplifier is configured as described above, it can be seen that the first and the second upper lines T1 and T2 extending from the memory cell block formed over the sense amplifier are adjacent to the first and the second lower lines B1 and B2 extending from the memory cell block formed under the sense amplifier, respectively.

Coupling capacitance is generated between lines that form a BL sense amplifier. This may become a factor to deteriorate the performance of the BL sense amplifier that has to amplify a fine current. Furthermore, this coupling capacitance becomes more severe between lines that are extended from the same memory cell block.

In order to achieve a shield effect by solving this problem, an additional stable power line between the lines that form the BL sense amplifier are needed.

In order to insert the additional power line into the same area in addition to the lines of the BL sense amplifier, there is a burden on a process of further narrowing the width between the lines and a space into which the additional power line will be inserted is not sufficient according to an increase in the degree of integration of semiconductor devices.

SUMMARY

In an embodiment, a bit line sense amplifier disposed between a first memory cell block and a second memory cell block adjacent to the first memory cell block includes first and third switching elements substantially symmetrically formed in a first direction so that the drain terminals of the first and third switching elements face each other, second and fourth switching elements substantially symmetrically formed in the first direction so that the drain terminals of the second and fourth switching elements face each other, a first line configured to electrically couple the gate terminal of the first switching element and the drain terminal of the second switching element, and a second line configured to electrically couple the gate terminal of the third switching element and the drain terminal of the fourth switching element, wherein the first and the second switching elements may be substantially symmetrically formed in a second direction substantially vertical to the first direction, the third and the fourth switching elements may be substantially symmetrically formed in the second direction, and the first line and the second line may extend from different memory cell blocks.

In an embodiment, a layout method for a bit line sense amplifier includes forming first and third switching elements substantially symmetrically in a first direction over a semiconductor substrate so that the drain terminals of the first and third switching elements face each other, forming second and fourth switching elements substantially symmetrically in the first direction over the semiconductor substrate so that that the drain terminals of the second and fourth switching elements face each other, electrically coupling the gate terminal of the first switching element and the drain terminal of the second switching element using a first line, and electrically coupling the gate terminal of the third switching element and the drain terminal of the fourth switching element using a second line that extends from a memory cell block different from a memory cell block from which the first line extends, wherein the first and the second switching elements may be substantially symmetrically formed in a second direction substantially vertical to the first direction, and the third and the fourth switching elements may be substantially symmetrically formed in the second direction.

BRIEF DESCRIPTION OF THE DRAWINGS

Features, aspects, and embodiments are described in conjunction with the attached drawings, in which.

DETAILED DESCRIPTION

Hereinafter, a BL sense amplifier and a layout method therefor according to various embodiments will be described below with reference to the accompanying drawings through the embodiments.

Figure 4:
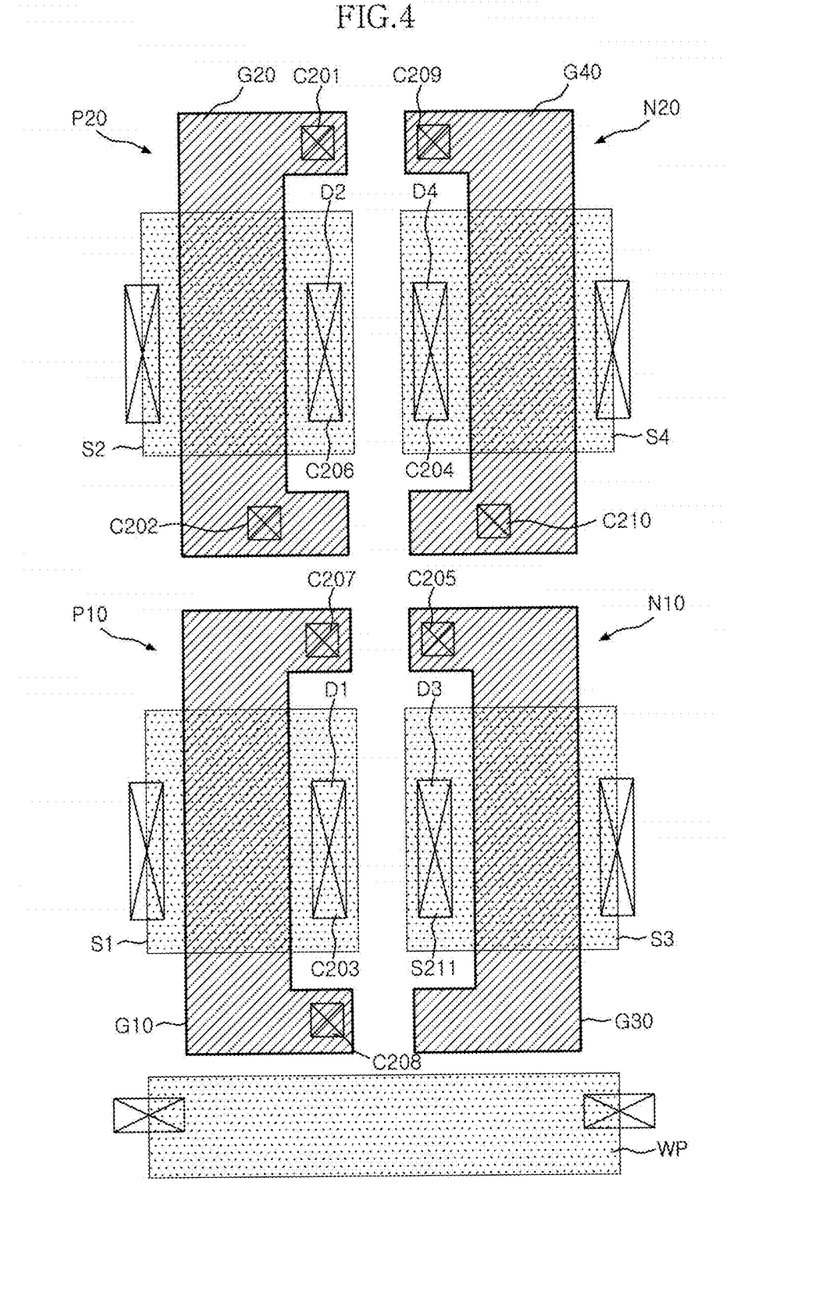
FIGS. 4 and 5 are the layout diagrams of a BL sense amplifier in accordance with an embodiment.
Figure 5:
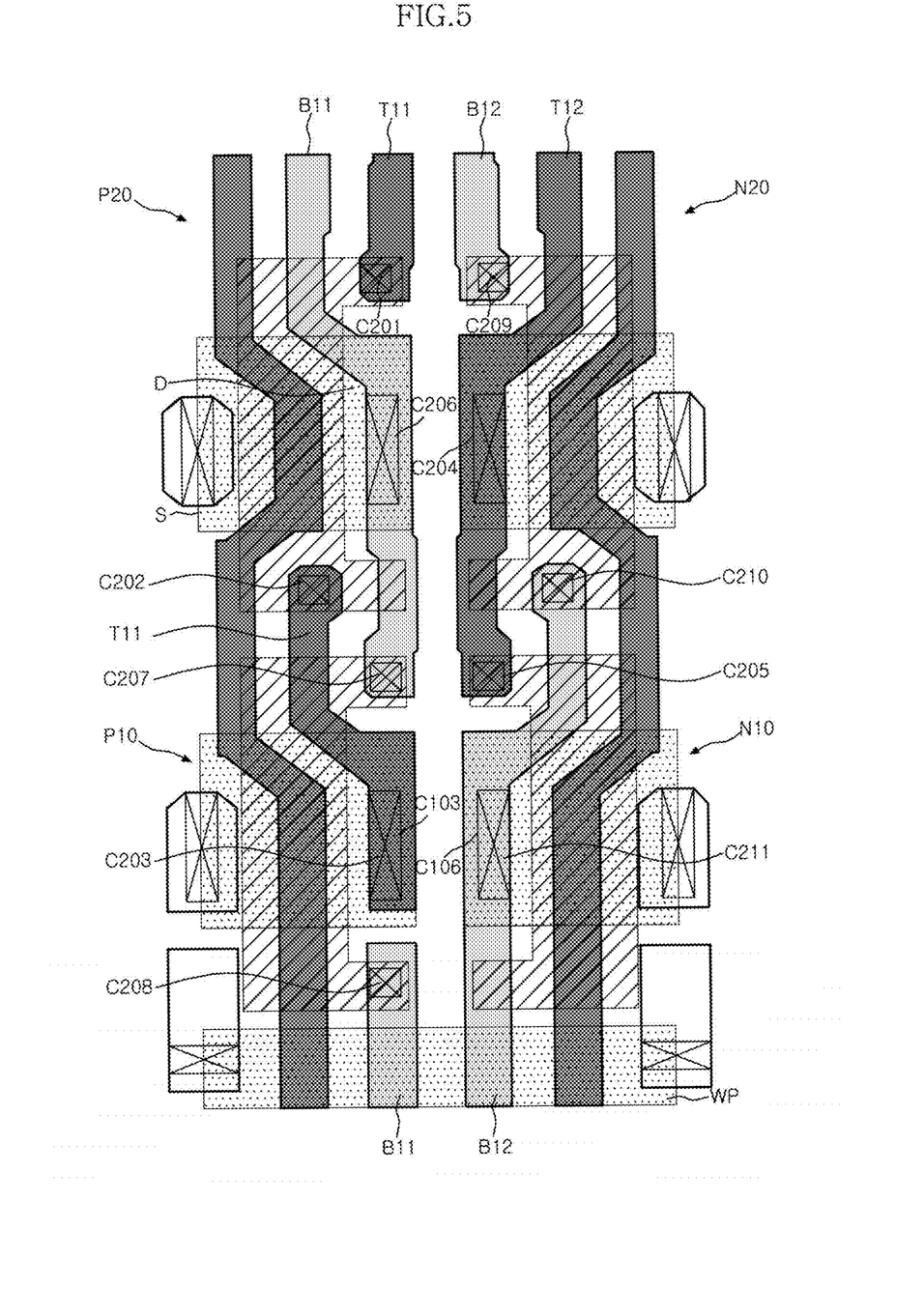

FIGS. 4 and 5 are layout diagrams of a BL sense amplifier in accordance with an embodiment.

Coupling capacitance between lines that are extended from one memory cell block becomes more severe than coupling capacitance between lines that are extended from the other memory cell block.

In the embodiments, when forming the lines of a sense amplifier unit that forms an open BL sense amplifier, lines extending from different memory cell blocks are adjacently formed by keeping in mind the above point. In other words, lines extending from an upper memory cell block and lines extending from a lower memory cell block are alternately disposed so that coupling capacitance is reduced.

First, referring to FIG. 4, the BL sense amplifier in accordance with an embodiment may include a first switching element P10, a second switching element P20, a third switching element N10, and a fourth switching element N20. The BL sense amplifier may also include sources S1-S4 and a well pickup region WP as illustrated in FIG. 4.

The first switching element P10 and the third switching element N10 may be formed substantially symmetrical in a first direction so that respective drain terminals D1 and D3 face each other, and the second switching element P20 and the fourth switching element N20 may be substantially symmetrical in the first direction so that respective drain terminals D2 and D4 face each other. Furthermore, the first switching element P10 and the second switching element P20 may be formed substantially symmetrical in a second direction substantially vertical to the first direction, and the third switching element N10 and the fourth switching element N20 may be formed substantially symmetrical in substantially the second direction.

The switching elements P10, N10, P20, and N20 may include respective gate terminals G10 to G40 each having a length extending substantially in the first direction. Furthermore, the gate terminal G20 of the second switching element P20 may include first and second contacts C201 and C202 formed at both ends of a length direction thereof. The gate terminal G40 of the fourth switching element N20 may include ninth and tenth contacts C209 and C210 formed at both ends of a length direction thereof. Furthermore, the gate terminal G10 of the first switching element P10 may include seventh and the eighth contacts C207 and C208 formed at both ends of a length direction thereof, and the gate terminal G30 of the third switching element N10 may include a fifth contact C205 formed at a portion adjacent to the fourth switching element N20.

The first and the second contacts C201 and C202, the fifth contact C205, and the seventh to tenth contacts C207, C208, C209, and C210 are gate contacts. Furthermore, the third and the fourth contacts C203 and C204 and the sixth and the eleventh contacts C206 and C211 are drain contacts.

The gate terminal G20 of the second switching element P20 has to be connected to the drain terminal D1 of the first switching element P10. To this end, the first to third contacts C201, C202, and C203 can be used. Furthermore, the drain terminal D2 of the second switching element P20 has to be connected to the gate terminal G10 of the first switching element P10. To this end, the sixth to eighth contacts C206, C207, and C208 can be used.

Likewise, the gate terminal G40 of the fourth switching element N20 has to be connected to the first drain terminal D3 of the third switching element N10. To this end, the ninth to eleventh contacts C209, C210, and C211 can be used. Furthermore, the second drain terminal D4 of the fourth switching element N20 has to be connected to the gate terminal G30 of the third switching element N10. To this end, the fourth and the fifth contacts C204 and C205 can be used.

Referring to FIG. 5, the sixth to eighth contacts C206, C207, and C208 are coupled by a first lower line B11. If a line for coupling the first to third contacts C201, C202, and C203 (i.e., C103) is extended from the same memory cell block as that of the first lower line B11, coupling capacitance can become severe because the line is formed to be adjacent to the first lower line B11. Thus, the line for coupling the first to third contacts C201, C202, and C203 is coupled by a first upper line T11.

A line for coupling the ninth to eleventh contacts C209, C210, and C211 is adjacent to the first upper line T11, and thus the ninth to eleventh contacts C209, C210, and C211 (i.e., C106) are coupled by a second lower line B12 according to a similar principle. The fourth and the fifth contacts C204 and C205 are coupled by a second upper line T12.

Like FIG. 4, FIG. 5 also illustrates a well pick up region WP and indicates a source S and a drain D of the switching elements. In fact, first switching element P10, third switching element N10, second switching element P20, and fourth switching element N20 of FIG. 4 are also illustrated in FIG. 5.

Figure 6:
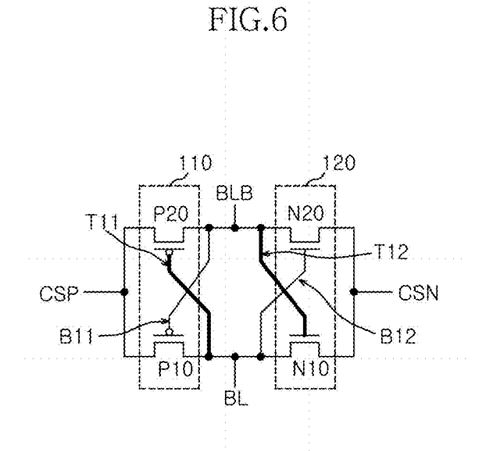
FIG. 6 shows the construction of a BL sense amplifier in accordance with an embodiment.

FIG. 6 shows the construction of a BL sense amplifier in accordance with an embodiment.

The BL sense amplifier may include a sense amplifier unit, a precharge and equalization unit, a column selection unit, etc. FIG. 6 shows only the sense amplifier unit.

Referring to FIG. 6, the sense amplifier unit of the BL sense amplifier receives a first sense amplifier power line signal CSP and a second sense amplifier power line signal CSN and amplifies a difference between the currents of a bit line pair BL and BLB.

More particularly, a first sense amplifier unit 110 may include the first switching element P10 and the second switching element P20 configured to have source terminals connected to a supply terminal for the first sense amplifier power line CSP in common and drain terminals connected to the bit line BL and the bit line bar BLB, respectively. The gate terminal of the first switching element P10 and the drain terminal of the second switching element P20 are coupled by the first lower line B11. Furthermore, the drain terminal of the first switching element P10 and the gate terminal of the second switching element P20 are coupled by the first upper line T11.

A second sense amplifier unit 120 may include the third switching element N10 and the fourth switching element N20 configured to have source terminals connected to a supply terminal for the second sense amplifier power line CSN in common and drain terminals connected to the bit line BL and the bit line bar BLB, respectively. The drain terminal of the third switching element N10 and the gate terminal of the fourth switching element N20 are coupled by the second lower line B12. Furthermore, the gate terminal of the third switching element N10 and the drain terminal of the fourth switching element N20 are coupled by the second upper line T12.

The sense amplifier unit of FIG. 1 may include the lines formed so that the lines B1 and B2 extending from a memory cell block disposed under the BL sense amplifier are adjacent to each other and the lines T1 and T2 extending from a memory cell block disposed over the BL sense amplifier are adjacent to each other. Accordingly, coupling capacitance is increased.

In the various embodiments associated with FIGS. 4-6, however, coupling capacitance can be minimized because the lines B11 and B12 extended from a memory cell block disposed under the BL sense amplifier and the lines T11 and T12 extending from a memory cell block disposed over the BL sense amplifier are alternately disposed as shown in FIG. 6.

While various embodiments have been described above, it will be understood to those skilled in the art that the embodiments described are by way of example only. Accordingly, the BL sense amplifier and the layout method therefor described herein should not be limited based on the described embodiments.

What is claimed is:

1. A bit line sense amplifier disposed between a first memory cell block and a second memory cell block adjacent to the first memory cell block, the bit line sense amplifier comprising:
    first and third switching elements substantially symmetrically formed in a first direction so that drain terminals of the first and third switching elements face each other;
    second and fourth switching elements substantially symmetrically formed in the first direction so that drain terminals of the second and fourth switching elements face each other;
    a first line formed on a first level, configured to electrically couple a gate terminal of the first switching element and the drain terminal of the second switching element; and
    a second line formed on a second level which is different from a first level, configured to electrically couple a gate terminal of the third switching element and the drain terminal of the fourth switching element,
    wherein the first and the second switching elements are substantially symmetrically formed in a second direction substantially vertical to the first direction, the third and the fourth switching elements are substantially symmetrically formed in the second direction, and the first line and the second line extend from different memory cell blocks,
    and the first line and the second line are substantially symmetrically formed.

2. The BL sense amplifier according to claim 1, further comprising a third line configured to electrically couple the drain terminal of the first switching element and a gate terminal of the second switching element, wherein the first line and the third line extend from different memory cell blocks.

3. The BL sense amplifier according to claim 2, wherein the first switching element and the second switching element comprise source terminal, respectively, and
    further comprising a first sense amplifier power line electrically coupled to the source terminal of the first switching element and the source terminal of the second switching element.

4. The BL sense amplifier according to claim 3, wherein the third switching element and the fourth switching element comprise source terminal, respectively, and
    further comprising a second sense amplifier power line electrically coupled to the source terminal of the third switching element and the source terminal of the fourth switching element.

5. The BL sense amplifier according to claim 2, wherein:
    the first line extends from a first memory cell block, and
    the second line and the third line extend from a second memory cell block.

6. The BL sense amplifier according to claim 5, wherein:
    the first memory cell block is disposed under the BL sense amplifier,
    the second memory cell block is disposed over the BL sense amplifier, and
    the first memory cell block is connected to the BL sense amplifier through a bit line bar, and the second memory cell block is connected to the BL sense amplifier through a bit line.

7. The BL sense amplifier according to claim 2, further comprising a fourth line configured to electrically couple the drain terminal of the third switching element and a gate terminal of the fourth switching element, wherein the second line and the fourth line extend from different memory cell blocks, and the third line and the fourth line are substantially symmetrically formed.

8. The BL sense amplifier according to claim 7, wherein:
the first line and the fourth line extend from a first memory cell block, and
the second line and the third line extend from a second memory cell block.

9. The BL sense amplifier according to claim 8, wherein:
the first memory cell block is disposed under the BL sense amplifier,
the second memory cell block is disposed over the BL sense amplifier, and
the first memory cell block is connected to the BL sense amplifier through a bit line bar, and the second memory cell block is connected to the BL sense amplifier through a bit line.

10. A layout method for a bit line sense amplifier, comprising:
forming first and third switching elements substantially symmetrically in a first direction over a semiconductor substrate so that drain terminals of the first and third switching elements face each other;
forming second and fourth switching elements substantially symmetrically in the first direction over the semiconductor substrate so that that drain terminals of the second and fourth switching elements face each other;
electrically coupling a gate terminal of the first switching element and the drain terminal of the second switching element using a first line, wherein the first line is formed on a first level, extended from a first memory cell block; and
electrically coupling a gate terminal of the third switching element and the drain terminal of the fourth switching element using a second line, wherein the first line is formed on a first level which is different from the first level, that extends from a second memory cell block adjacent to the first memory cell block by a second direction substantially vertical to the first direction,
wherein the first and the second switching elements are substantially symmetrically formed in the second direction, and the third and the fourth switching elements are substantially symmetrically formed in the second direction,
and the bit line sense amplifier is disposed between the first memory cell block and the second memory cell block,
and the first line and the second line are substantially symmetrically formed.

11. The layout method according to claim 10, further comprising electrically coupling the drain terminal of the first switching element and a gate terminal of the second switching element using a third line that extends from a memory cell block different from the memory cell block from which the first line extends.

12. The layout method according to claim 11, wherein the first switching element and the second switching element comprise source terminal, respectively, and
further comprising electrically coupling a first sense amplifier power line to the source terminal of the first switching element and the source terminal of the second switching element.

13. The layout method according to claim 12, wherein the third switching element and the fourth switching element comprise source terminal, respectively, and
further comprising electrically coupling a second sense amplifier power line to the source terminal of the third switching element and the source terminal of the fourth switching element.

14. The layout method according to claim 11, wherein:
the first line extends from the first memory cell block, and
the second line and the third line extend from the second memory cell block.

15. The layout method according to claim 14, wherein:
the first memory cell block is disposed under the bit line sense amplifier,
the second memory cell block is disposed over the bit line sense amplifier, and
the first memory cell block is connected to the BL sense amplifier through a bit line bar, and the second memory cell block is connected to the BL sense amplifier through a bit line.

16. The layout method according to claim 11, further comprising electrically coupling the drain terminal of the third switching element and a gate terminal of the fourth switching element using a fourth line that extends from a memory cell block different from the memory cell block from which the second line extends,
and the third line and the fourth line are substantially symmetrically formed.

17. The layout method according to claim 16, wherein:
the first line and the fourth line extend from a first memory cell block, and
the second line and the third line extend from a second memory cell block.

18. The layout method according to claim 17, wherein:
the first memory cell block is disposed under the bit line sense amplifier,
the second memory cell block is disposed over the bit line sense amplifier, and the first memory cell block is connected to the BL sense amplifier through a bit line bar, and the second memory cell block is connected to the BL sense amplifier through a bit line.

* * * * *